United States Patent
Brown et al.

[19]

[11] Patent Number: 6,075,711
[45] Date of Patent: Jun. 13, 2000

[54] SYSTEM AND METHOD FOR ROUTING CONNECTIONS OF INTEGRATED CIRCUITS

[75] Inventors: Sammy K. Brown, Los Gatos; George E. Avery, Saratoga; Andrew K. Wiggin, San Carlos, all of Calif.

[73] Assignee: Alpine Microsystems, Inc., Campbell, Calif.

[21] Appl. No.: 08/950,029

[22] Filed: Oct. 14, 1997

Related U.S. Application Data

[60] Provisional application No. 60/028,905, Oct. 21, 1996.

[51] Int. Cl.[7] .............................. H05K 1/11; H01L 25/00
[52] U.S. Cl. ...................... 361/761; 361/764; 361/772; 361/777; 257/684; 257/700; 174/261
[58] Field of Search ................................ 174/250, 260, 174/261; 257/684, 690, 700, 69 B, 723, 724, 777; 361/761, 763, 764, 772, 774, 777, 783, 790, 803; 439/68

[56] References Cited

U.S. PATENT DOCUMENTS

| | | | |
|---|---|---|---|
| 3,614,832 | 10/1971 | Chance et al. | 29/626 |
| 4,285,002 | 8/1981 | Campbell. | |
| 4,445,274 | 5/1984 | Suzuki et al. | 29/832 |
| 4,903,120 | 2/1990 | Beene et al. | 357/74 |
| 5,072,331 | 12/1991 | Thiele et al. | 361/380 |
| 5,198,963 | 3/1993 | Gupta et al. | 257/777 |
| 5,541,450 | 7/1996 | Jones et al. | 257/697 |
| 5,608,262 | 3/1997 | Degani et al. | 257/723 |
| 5,615,089 | 3/1997 | Yoneda et al. | 361/764 |

FOREIGN PATENT DOCUMENTS

57-32661  2/1982  Japan ...................................... 257/690

*Primary Examiner*—Leo P. Picard
*Assistant Examiner*—David Foster
*Attorney, Agent, or Firm*—Townsend and Townsend and Crew LLP

[57] ABSTRACT

A system and method for efficiently interconnecting a plurality of ICs, thereby improving the electrical performance of the overall system. In one embodiment of the system of the present invention, a plurality of carriers corresponds to a plurality of ICs, and a board has a plurality of board regions for receiving the plurality of ICs. In one embodiment of the method of the present invention, a carrier is provided for each IC in a complex IC. A board having openings is provided, and the ICs are fitted into the board openings with the carriers mounted thereto.

20 Claims, 10 Drawing Sheets

SYSTEM AND METHOD FOR ROUTING CONNECTIONS OF INTEGRATED CIRCUITS

CROSS REFERENCE TO RELATED APPLICATIONS

This application is a nonprovisional application of U.S. provisional patent application "A SYSTEM AND METHOD FOR PACKAGING INTEGRATED CIRCUITS," U.S. Ser. No. 60/028,905, filed Oct. 21, 1996, having Sammy K. Brown, George E. Avery, and Andrew K. Wiggin listed as co-inventors and assigned to Alpine Microsystems. The 60/028,905 application is hereby incorporated by reference in its entirety.

BACKGROUND OF THE INVENTION

The present invention relates to the packaging of semiconductor devices, and more particularly to a system and method for interconnecting integrated circuits (ICs) on a semiconductor substrate.

Electronic systems typically are manufactured from two or more ICs to provide complete system function. Until recently the limitations on performance and number of I/O pins were not significant for the vast majority of applications. However, as more devices are integrated in a single IC and as clock speeds increase, limitations on performance and number of I/O pins would be of paramount concern to semiconductor manufacturers. This is because the overall performance of an electronic system based on multiple ICs is a function of the performance of the individual ICs and of the performance of the signals between the ICs. The performance of the signals between the ICs is in turn a function of the number of signals and the electrical characteristics of the means used to connect the I/O pins of the ICs. A more efficient means for interconnecting ICs is therefore becoming an important influence on the cost, size, performance, weight, and efficiency of electronic systems.

Currently, the most common method used for interconnecting ICs is to first package the individual ICs, and then mount the packaged ICs on a substrate such as a printed circuit board. The size of the package is typically several times larger than the IC and is often manufactured from a metal lead frame and protected within a plastic molded case. The packaged ICs are then placed and soldered to a printed circuit board to create a complete electronic system. The advantages of the current method include low cost and protection of the IC during subsequent handling. In addition, the package acts as a standardized carrier for testing of the IC, such that design changes to the printed circuit board may be made cheaply and quickly. Assembly of the IC to the printed circuit board may further be automated. Finally, the current system allows rework of the printed circuit.

A more efficient method is necessary, however, as advanced ICs require higher performance and larger number of I/O pins than is possible with conventional interconnect technology. The conventional method has limited electrical performance and limited ability to remove heat. The electrical parasitic characteristics of the package, the length of conductors, the electrical parasitic introduced by the structures of the printed circuit board, and the dielectric material used in the printed circuit board all limit the electrical performance of the method. These limitations in turn limit the number of signals on the system to at most a few hundred regardless of the complexity of the IC or the system. Since the current IC interconnection has lower performance than the ICs, it limits the overall system performance.

Integrated circuits are performing at above 100 MHz. The current method of interconnecting ICs is, however, limited to systems operating below 100 MHz. An efficient means of interconnecting integrated circuits is therefore necessary to keep pace with corresponding advances in integrated circuit performance.

SUMMARY OF THE INVENTION

The present invention provides a system and method for efficiently interconnecting a plurality of ICs, thereby improving the electrical performance of the overall system.

In one embodiment of the system of the present invention, a plurality of carriers corresponds to a plurality of ICs, and a board has a plurality of board regions for receiving the plurality of ICs. Each carrier has first and second sets of contacts, and a set of interconnects therebetween. The first set of contacts connects to contacts on the corresponding IC when the corresponding IC is mounted to the carrier's surface. Each board region has a set of board contacts connecting to the respective carrier's second set of contacts, and the board has a set of board interconnects connecting selected contacts of the set of board contacts. The plurality of board regions are further formed with an opening sized to clear the respective carrier's IC when the respective carrier is mounted to the board.

In one embodiment of the method of the present invention, a plurality of ICs is mounted to corresponding carriers. Each corresponding carrier has a surface with sufficient contacts, and a set of contacts on the carrier is routed to a set of contacts on the IC using embedded interconnects. A board having openings is provided, and the ICs are fitted into openings in the board with the carriers engaging the board.

These and other embodiments of the present invention, along with many of its advantages and features, are described in more detail in the text below and the attached figures. In the figures, like reference numerals indicate identical or functionally similar elements.

DESCRIPTION OF THE PREFERRED EMBODIMENT

The present invention provides a system and a method for efficient interconnection of ICs to form a complex electronic component with improved overall system performance.

Figure 1:
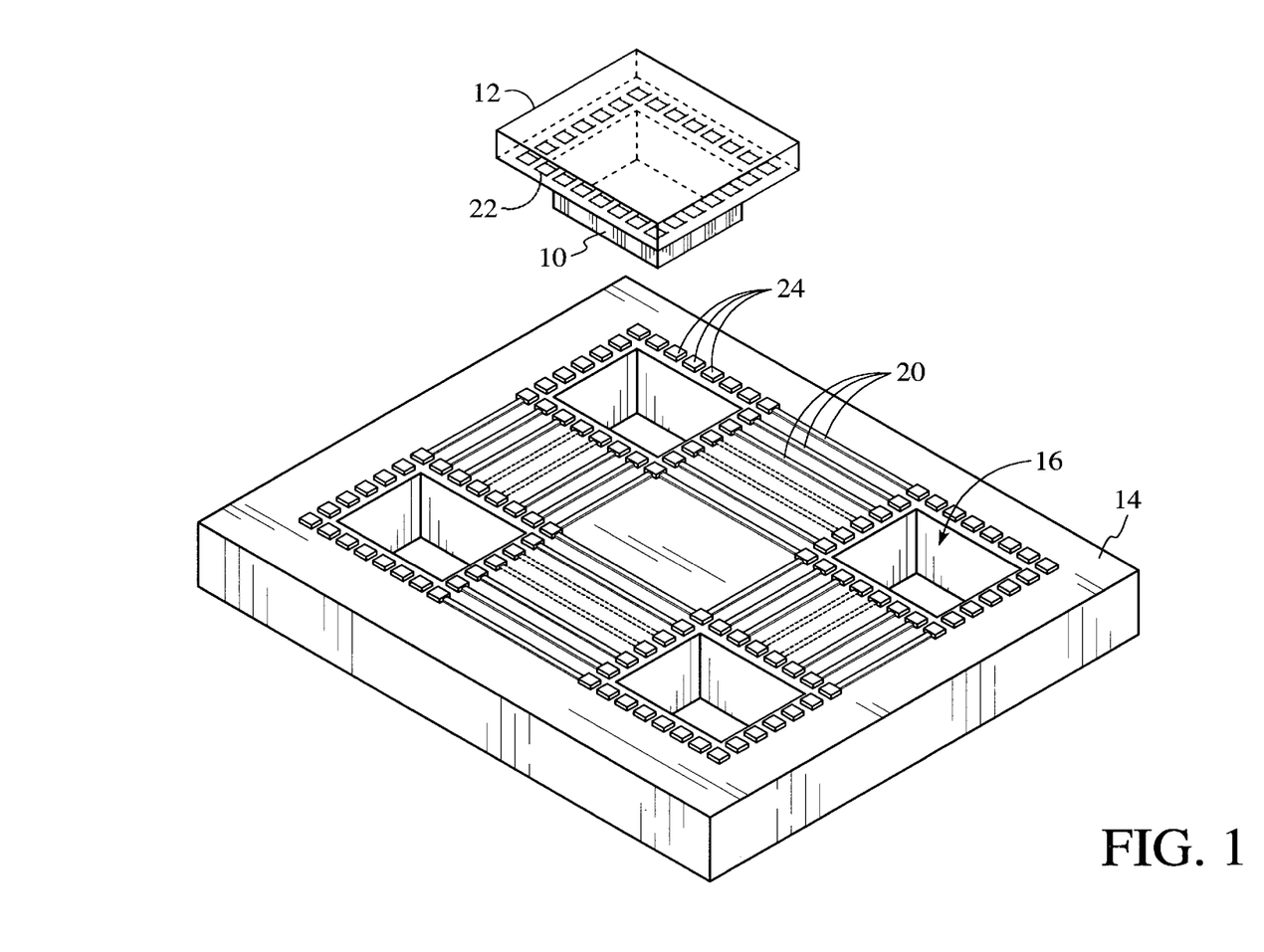
FIG. 1 shows an exploded view of the different components for efficient interconnection of ICs according to the system of the present invention.

FIG. 1 shows an exploded view of an IC 10 mounted to a carrier 12, and a board 14 with a plurality of openings 16. As shown, board 14 has four openings 16, however, the number of openings 16 changes according to the number of carriers to be connected to board 14. Similarly, though openings 16 are shown to be of equal sizes, they may differ in size in another example as the sizes of the openings are determined by the sizes of the ICs to be electrically connected to board 14. In the example as shown in FIG. 1, carrier 12 is connected to IC 10 only. However, as later discussed, carrier 12 may be connected to more than one IC or to other electronic components. If carrier 12 is connected to only one IC, the number of carriers for the system will depend on the number of ICs in the complex IC. In a preferred embodiment, the sizes of the carriers correspond to the sizes of the ICs in the complex IC, and the size of the board corresponds to the size of the complex IC.

Carrier 12 is preferably thermally compatible with board 14 and IC 10, since carrier 12 connects IC 10 and board 14. Thermal expansion compensation between IC 10, carrier 12, and board 14 may be accomplished by the use of compliant materials such as wires to make connections between the IC and the package. Alternatively, bonding materials may be used to limit the stresses. The preferred method, however, is to have carrier 12 and board 14 be made of materials with similar Coefficient of Thermal Expansion (CTE) as IC 10. In a preferred embodiment, carrier 12 and board 14 are made of the same material as IC 10. Since ICs are typically manufactured from single crystal silicon, which has a relatively low CTE, silicon is the preferred carrier and board material. However, gallium arsenide or other materials with comparable CTE may also be utilized.

FIG. 1 also shows the interconnections on board 14. Board 14 is manufactured employing semiconductor photo lithographic processes; hence, the routing density of board interconnections 20 on board 14 is higher than that for conventional board level interconnect. Connections 22 on carrier 12 are pre-manufactured to fit the bond pad pattern of connections 24 on board 14. Board 14, therefore, serves both as a mechanical base and implements at least a single layer of routing through interconnections 20 between neighboring carriers and ICs. There are preferably no vias in board 14 as the IC interconnections are preferably distributed among the carriers by allowing signals between the ICs to be passed through neighboring chips. Since all subsystem routing is preferably distributed across the individual carriers, the complexity of the board routing is reduced to single node sets. Compared to a single interconnection board, interconnection distributions among the carriers greatly simplify the interconnection task, and significantly improve the overall system performance. Although board 14 preferably has only one level of interconnect, in applications where yield is not critical, board 14 could have multiple levels of interconnect. In such applications, there would be vias in board 14 as the interconnections would include pass throughs as well as crossovers.

Figure 2A:
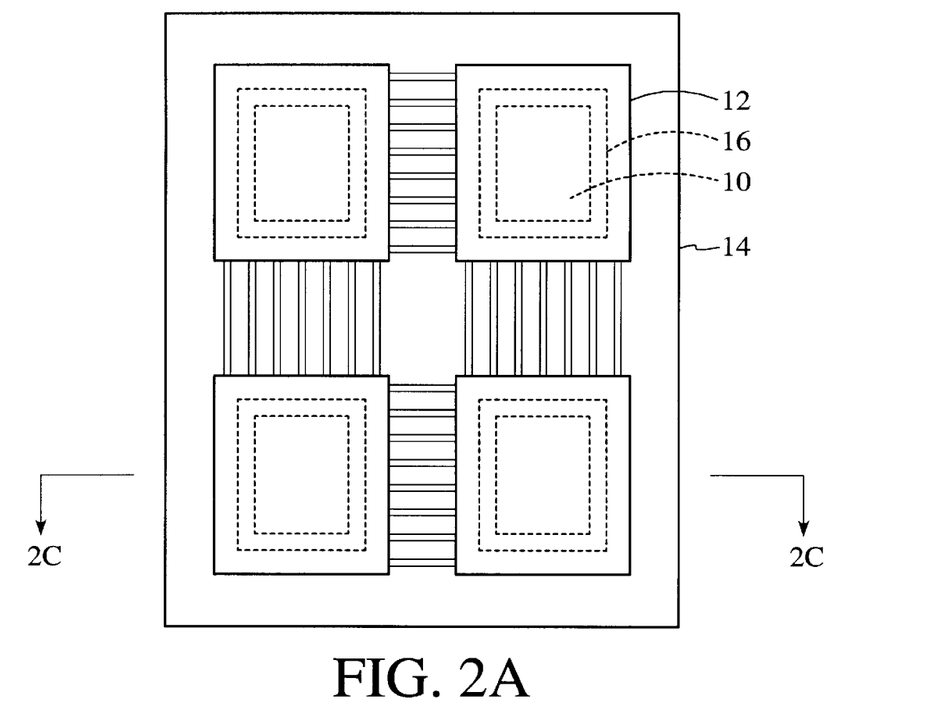
FIGS. 2A–2C show a top view of the IC/carrier subassembly on the board, a side view of the IC/carrier subassembly, and a side view of the IC/carrier subassembly on the board, respectively.
Figure 2B:
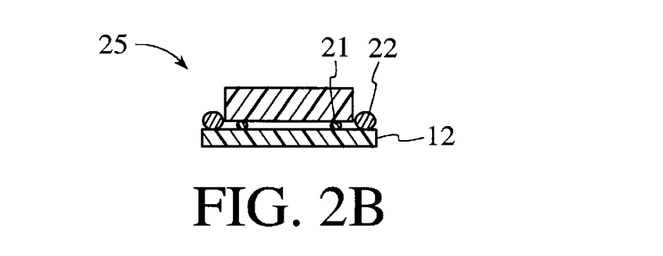
Figure 2C:
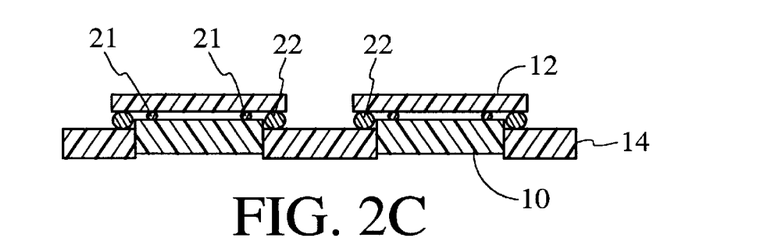

FIGS. 2A–2C show a top view of an IC/carrier subassembly 25 on board 14, a side view of IC/carrier subassembly 25, and a side view of IC/carrier subassembly 25 on board 14, respectively. As shown in FIG. 2B, subassembly 25 consists of IC 10 mounted to carrier 12. Carrier 12 is pre-manufactured with solder bumps (shown as connections 21 and 22) which are placed in arrays aligned to mirror the bond pad patterns of IC 10 and board 14, respectively. IC 10 is flip chip bonded to carrier 12 through connections 21. As shown in FIG. 2C, each subassembly 25 is mounted to board 14 so that IC 10 will fit within opening 16. As can be seen, carrier 12 extends around opening 16 and connects to board 14 through connections 22. Typically, the number of connections 21 between IC 10 and carrier 12 will not be equal to the number of connections 22 between carrier 12 and board 14.

The use of opening 16 enables all of the signal connections to lie in a plane formed by the top side of IC 10, the top side of carrier 12, and the top side of board 14. This configuration is very advantageous, as the chemical properties of silicon are such that it is impractical to form plated vias through silicon materials thicker than a few tenth of a micron. By using the same materials for carrier 12 and board 14, direct solder connections may be made between carrier 12 and board 14. Since IC 10 and carrier 12 are preferably made of the same materials, signal connections may also be directly soldered on the carrier and connected to the IC. As previously discussed, the solder bumps on carrier 12 are aligned to mirror IC 10's bond pad pattern. Hence, IC 10 need not be solder bumped.

The advantage of using solder bumps to connect the IC to the carrier, and the carrier to the board is that an area array may be used to maximize the number of external signal connections available. In addition, parasitics associated with wire bonding may be eliminated. Solder bump flip chip bonding is an automated process, and bumping cost does not increase with pin count. Hence, the use of solder bumps also enables integration of higher I/O pin counts while keeping cost low.

Figure 3:
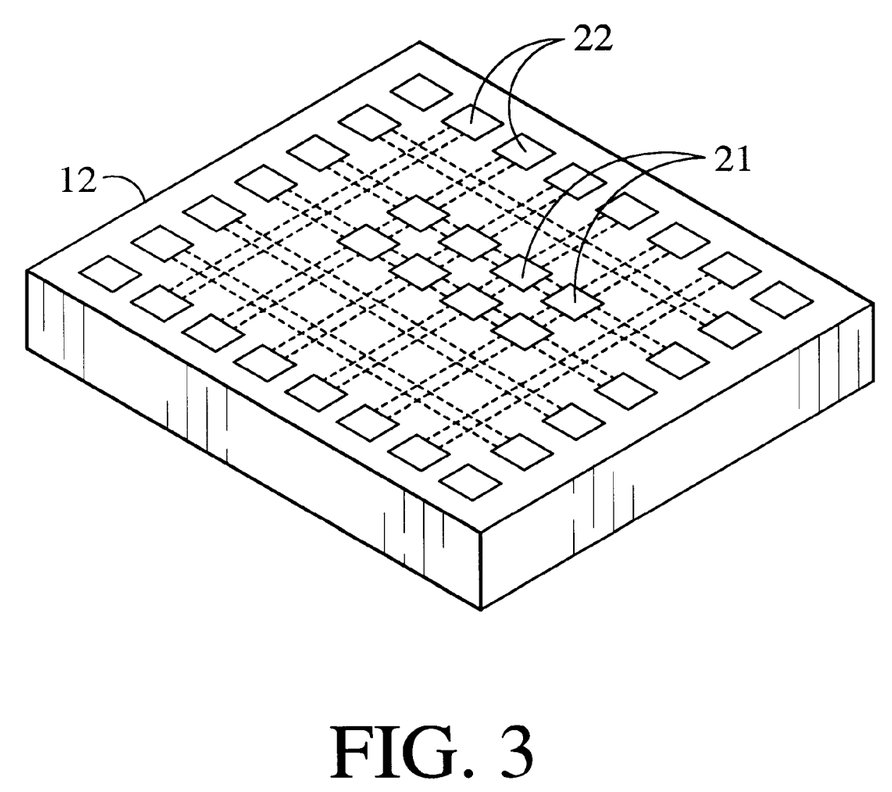
FIG. 3 shows an example set of electrical interconnections on a carrier.

FIG. 3 shows an exemplary electrical interconnection configuration on carrier 12. For simplicity, a relatively small number of connections are shown. As can be seen, carrier 12 has connections 22 along its peripherals and connections 21 around its central portion. Connections 21 and 22 connect IC 10 to carrier 12, and carrier 12 to board 14, respectively. Connections 21 may be routed to connections 22 using embedded interconnects, and such routing may have at least one crossover. These crossovers allow signals to be passed to and from the IC on carrier 12. In addition, the signal paths on carrier 12 may be independent of the IC routing. These independent signal paths serve as pass throughs for signals from a neighbor IC to other neighboring ICs. In this manner, interconnection of the ICs are distributed across the individual carriers.

Connections 21 and 22 are predetermined according to the application of the particular complex ICs. Since connections 21 and 22 are manufactured using semiconductor photolithography techniques, the resulting routing density is very similar to the density of on-chip interconnect. The number of connections between ICs, known as external interconnect, generally requires significantly less interconnect density than the interconnect density used to connect transistors on the IC. Hence, the external interconnection density can always be made high enough by using the same or less advanced semiconductor process that is used to fabricate the IC itself. Using this same technique, the external interconnections may also be made to fit into an area that is the same or less than the area of the IC itself. This provides a significant yield advantage over the current method as the size and area of printed circuit boards are generally many times larger than the ICs themselves.

Carrier 12 is manufactured from a multi-level semiconductor metallization process. Crossovers between the signal paths are achieved through the use of vias, which are located within the same layer. Since all the vias are in the same layer, custom changes to connections 21 and 22 may be made easily at the manufacturing level by single-mask programming. For each new application, the location of the vias may be determined according to the particular IC interconnections desired. Once the locations of the vias have been determined, only the via-containing layer needs to be changed.

Figure 4A:
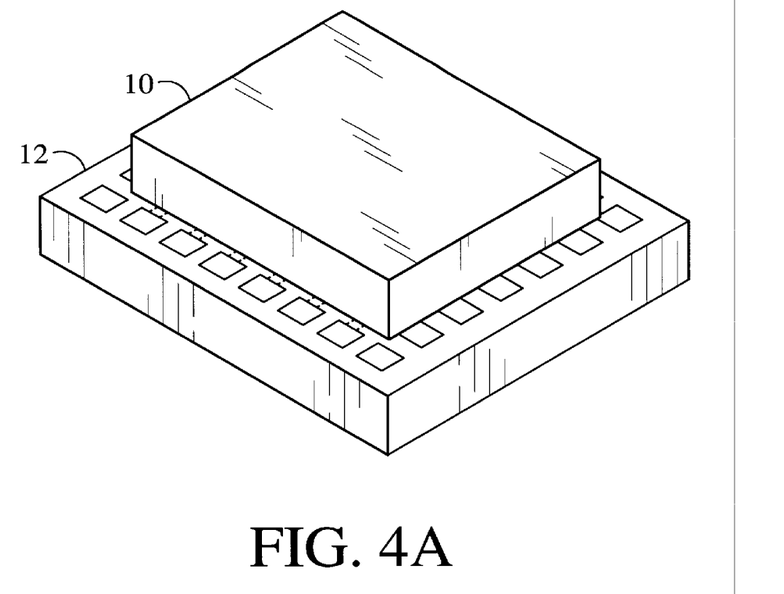
FIGS. 4A–4B show a single IC mounted on a carrier, and multiple ICs mounted on a carrier, respectively.
Figure 4B:
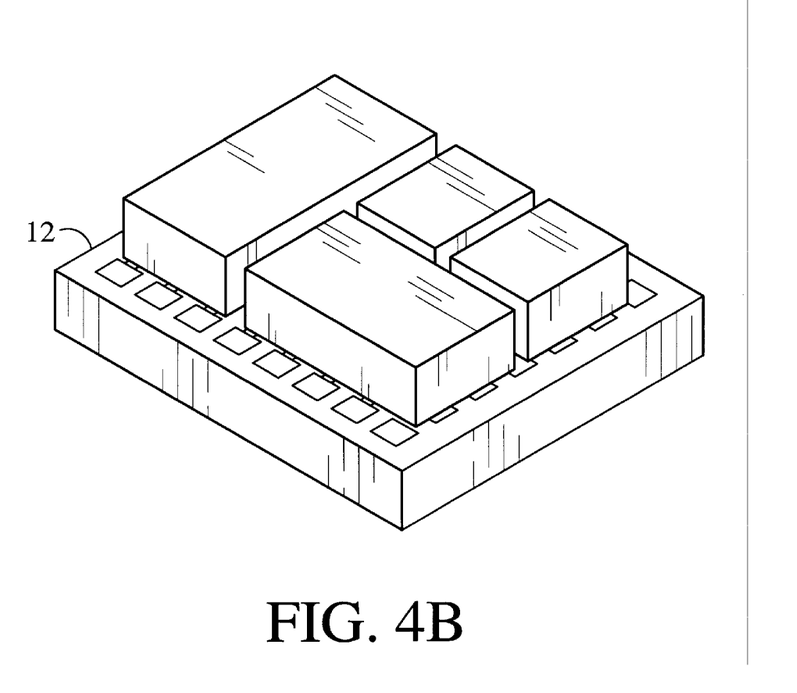

FIG. 4A shows a single IC 10 mounted on carrier 12. As shown in FIG. 4B, multiple ICs may also be mounted on carrier 12. Although FIGS. 4A and 4B show only ICs on carrier 12, resistors, capacitors, and other electrical components may be mounted on carrier 12 along with the ICs. Hence, carrier 12 functions as a multi-chip module within itself. This is very advantageous as more components may be interconnected on board 14. Moreover, with carrier 12 as an intermediate board, the interconnections are comparable to on-chip interconnects.

Figure 5:
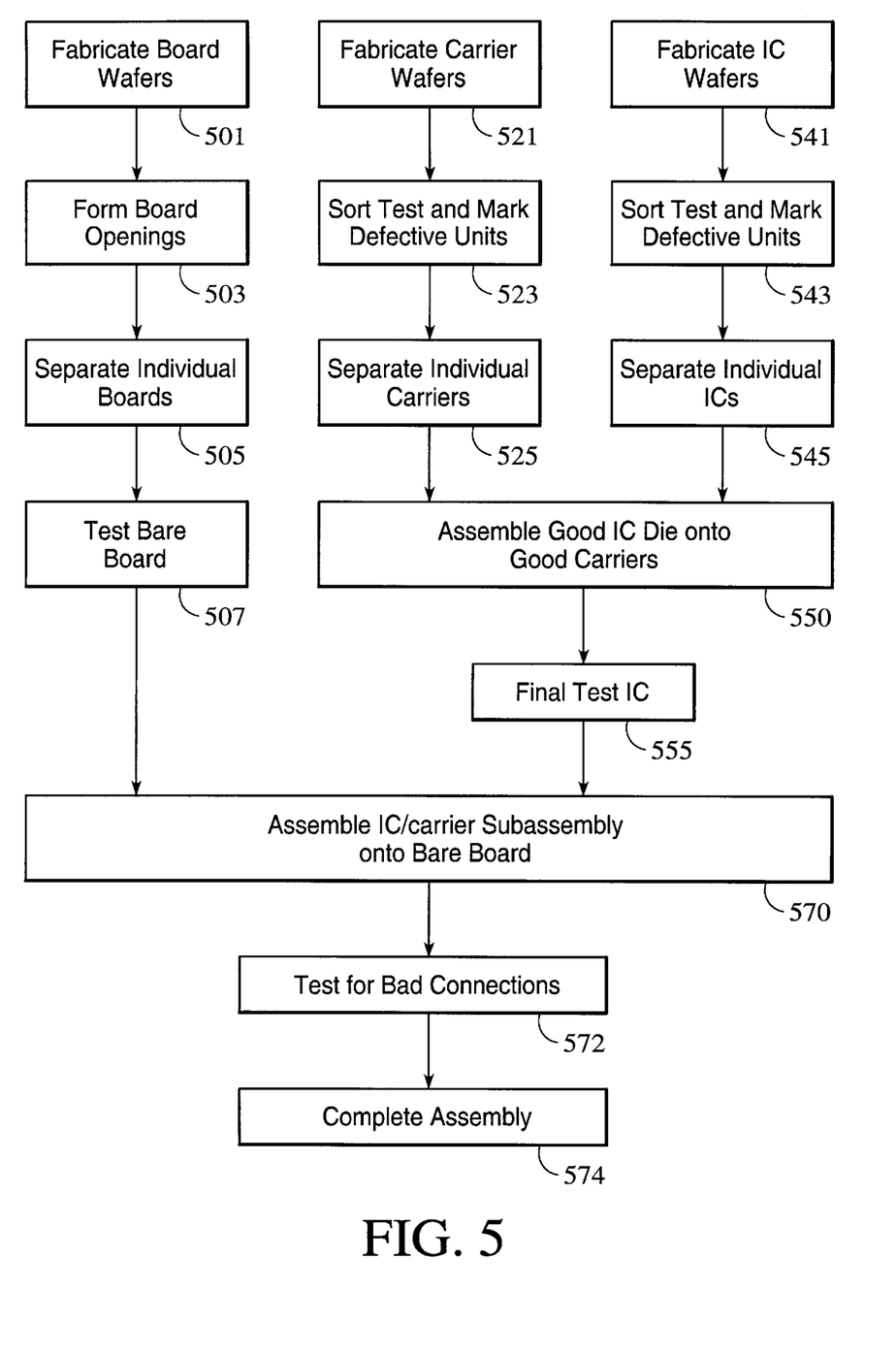
FIG. 5 shows the steps for interconnecting ICs efficiently according to the method of the present invention.

FIG. 5 is a flowchart showing the preferred method of interconnecting ICs according to the present invention. As shown, for each complex IC, the board wafers, the carrier wafers, and the IC wafers are separately manufactured. Referring to step 501, after the board wafers are fabricated, openings are formed in the boards at step 503. The individual boards are separated at step 505, and tested at step 507. The carriers are fabricated at step 521, and are tested and sorted for defective units at step 523. Defective units are discarded, and the good units are separated into individual carriers at step 525. Referring to steps 541 through 545, the ICs are also tested for defects once they are fabricated. The good units are also sorted from the defective units and are separated into individual ICs. At step 550, the good IC dies are mounted onto corresponding good carriers. After the ICs have been mounted to the carriers, a final test of the IC is conducted at step 555. This additional test before the IC is integrated with other subsystem ICs eliminates the burden of producing "known good die." Since no assumptions are made regarding the quality of the die, compound yield loss is also eliminated. The IC/carrier subassembly is mounted onto the board at step 570. Bad connections are tested for at step 572, and upon passing the test, the assembly is completed at step 574.

Figure 6:
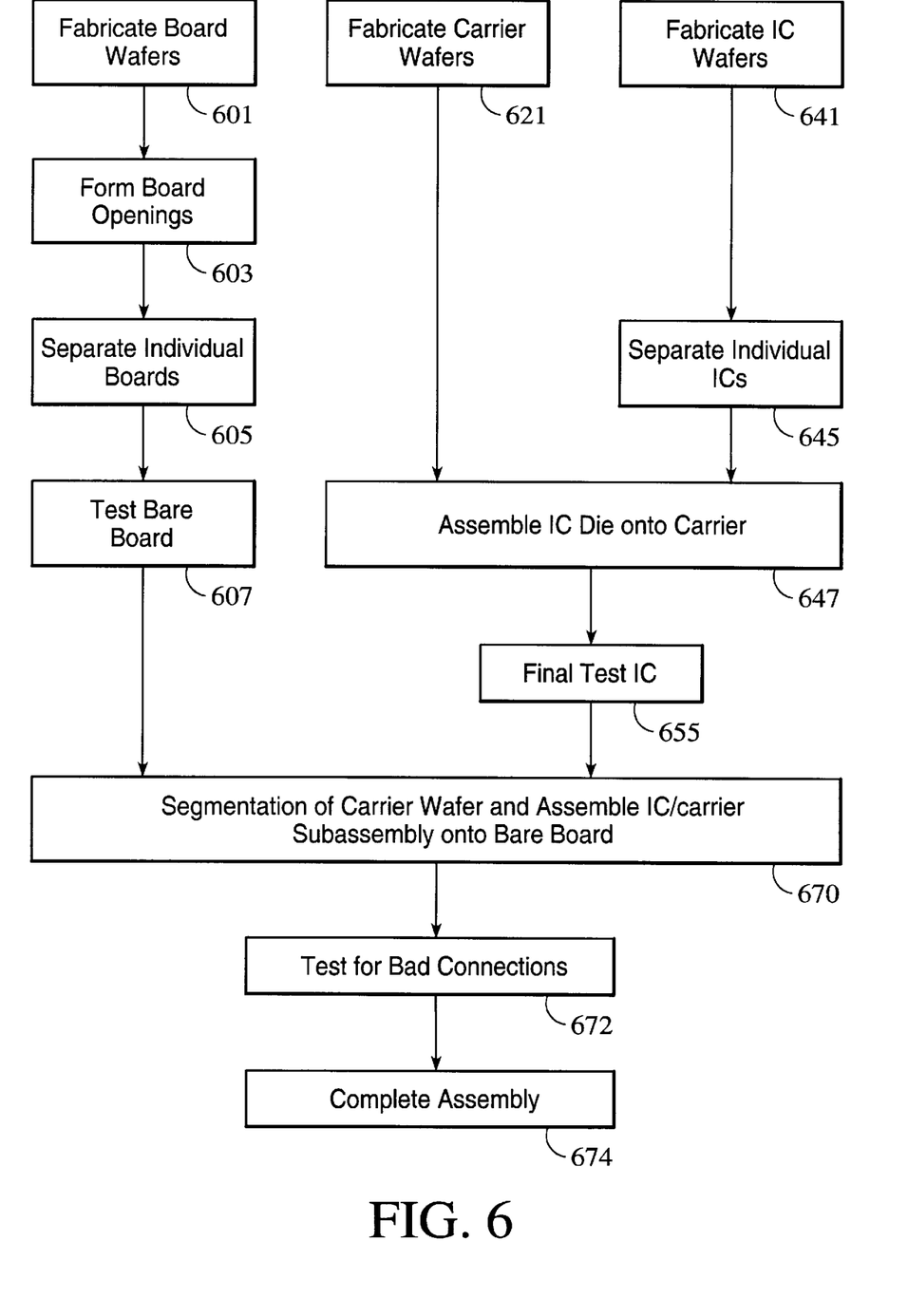
FIG. 6 shows the steps of a method for interconnecting ICs according to an alternate method of the present invention.
Figure 7:
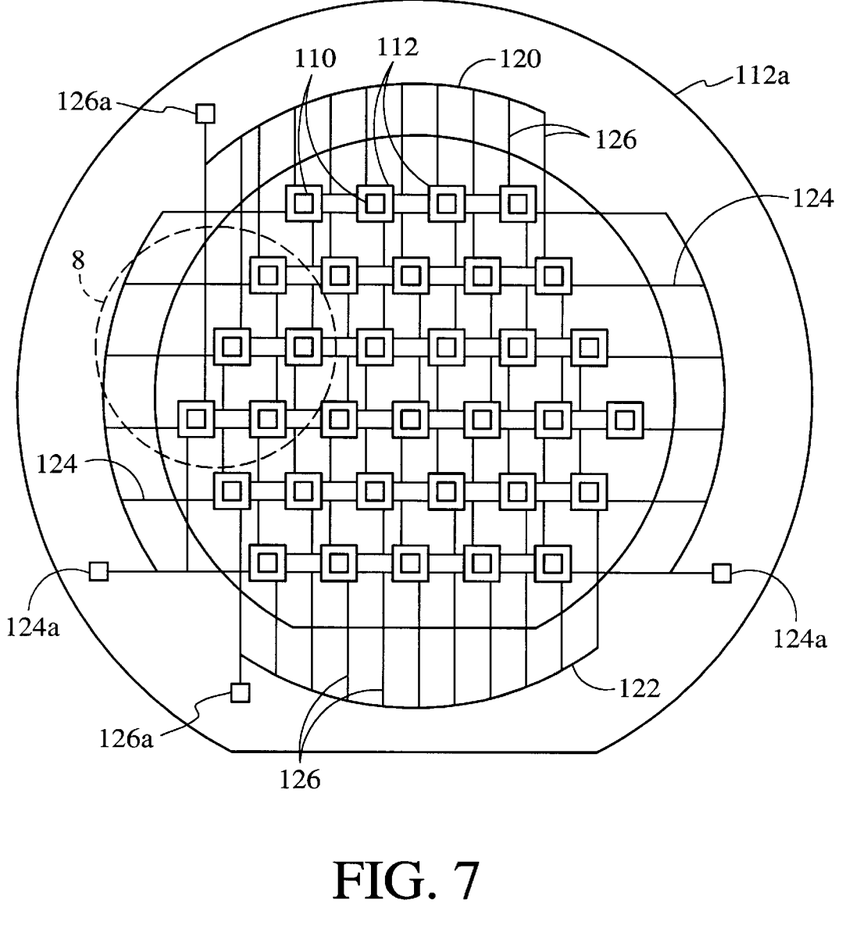
FIG. 7 is a simplified plan view of a carrier wafer in accord to the present invention.

Referring to FIGS. 6 and 7, an alternative method of interconnecting ICs according to the present invention is shown. Specifically, steps 601, 603, 605 and 607 correspond to steps 501, 503, 505 and 507, discussed above with respect to FIG. 5. The method shown in FIG. 6, however, differs in that the individual ICs 110 are assembled onto the carriers (not shown) before the carriers are segmented. Specifically, the carrier wafer 112a is fabricated at step 621 so as to have a plurality of spaced-apart carrier regions 112 located therein. In a separate process, ICs 110 are fabricated at step 641. Thereafter, the ICs 110 are segmented at step 645 and assembled onto the carrier wafer 112a at step 647, using the solder attach techniques discussed above. In this fashion, each carrier region 112 will have at least one IC 110 associated therewith.

Referring to FIGS. 3, 6 and 7, attachment of the ICs 110 before segmentation of the carriers 12 allows performing 100% functional testing or burn-in of the ICs 110, before final assembly. To that end, the carrier wafer 112 includes a power plane 120 and a ground plane 122, as well as signal paths 124. Each of the carrier regions 112 may be coupled to the power plane 120 and the ground plane 122 through interconnects 126. In this configuration, ICs 110, associated with the carrier regions 112, may be tested before complete assembly and shipment to an end user, at step 655. Specifically, the signal paths 124, the ground and power planes 120 and 122 and the interconnects 126 are in electrical communication with the requisite connections 21 to facilitate biasing and signal transmission to the ICs 110. Thus, early detection of defective ICs 110 may be achieved by reducing the costs incurred as a result of the defect. The carrier region 112 and IC 110 may be discarded after segmentation, but before final assembly into a board 14, thereby saving the cost of disposing of a properly functioning board 14. In addition, reduced is the probability that damage to the IC 110 will occur during functional testing, because coupling of the test signals and bias voltages to the ICs 110 occurs at coupling pads 124a and 126a. There is no physical contact with the IC 110 and the testing unit (not shown) during burn-in.

Figure 8:
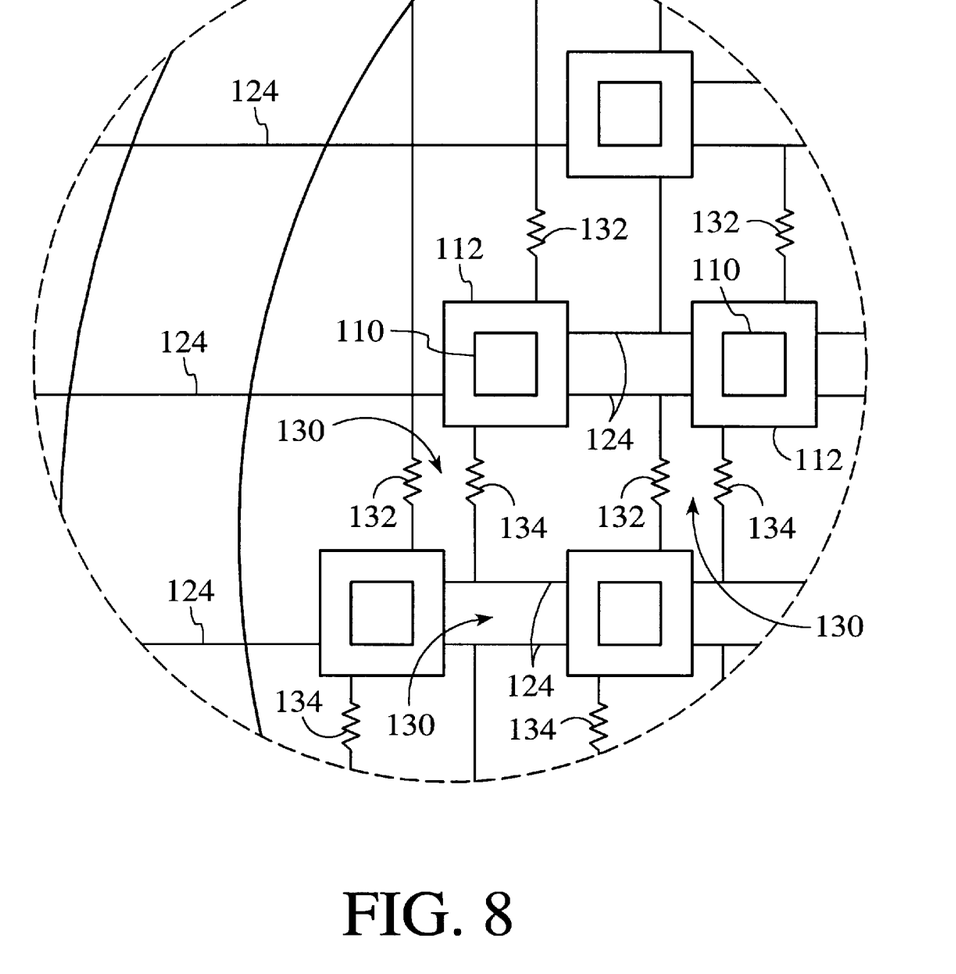
FIG. 8 is a detailed plan view of a portion of the carrier wafer shown in FIG. 7.

Referring to FIGS. 7 and 8, the signal paths 124 and interconnects 126 are routed to each of the carrier regions 112 by passing through test circuitry regions 130, located between adjacent carrier regions 112. Also included in the test circuitry regions 130 are other circuit elements necessary to properly configure the ICs located in the carrier regions 112 for functional testing. For example, isolation resistors 132 and 134 may be disposed therein. In this fashion, each IC 110 may be coupled to the power plane 120 and ground plane 122 via isolation resistors 132 and 134, respectively. This prevents a short associated with one of the carrier regions 112, from shorting the entire carrier wafer 112a. During the segmentation step 670, shown in FIG. 6, the test circuit regions 130 and the power and ground planes 120 and 122, shown in FIG. 8, are bisected. This allows segmentation of the carrier wafer 112a without damaging the individual carrier regions 112. Bad connections are tested for at step 672, and upon passing the test, the assembly is completed at step 674, shown in FIG. 6.

Figure 9:
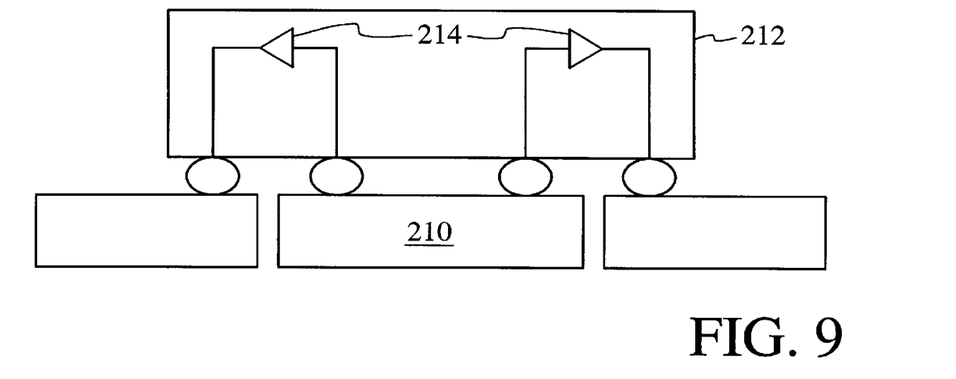
FIG. 9 is a plan schematic view of the carrier shown in FIGS. 2A–2C, in accord with a first alternate embodiment.
Figure 10:
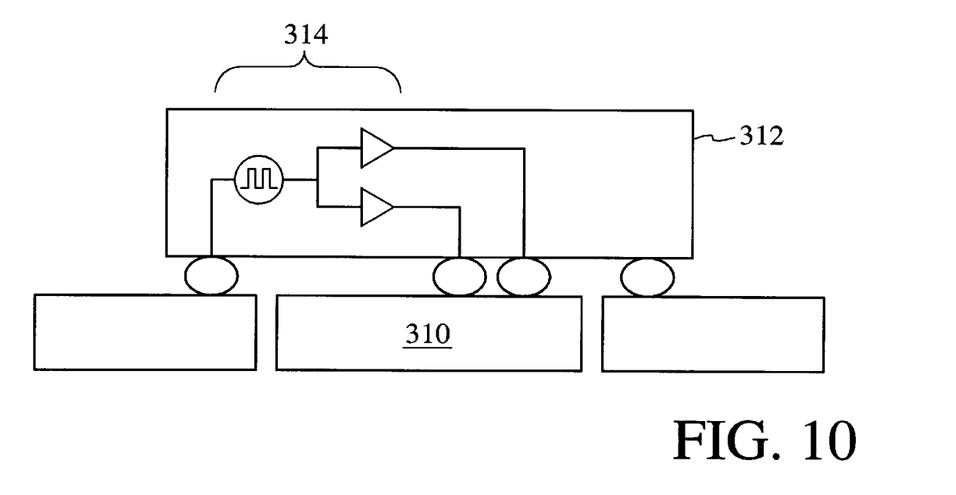
FIG. 10 is a plan schematic view of the carrier shown in FIGS. 2A–2C, in accord with a second alternate embodiment.
Figure 11:
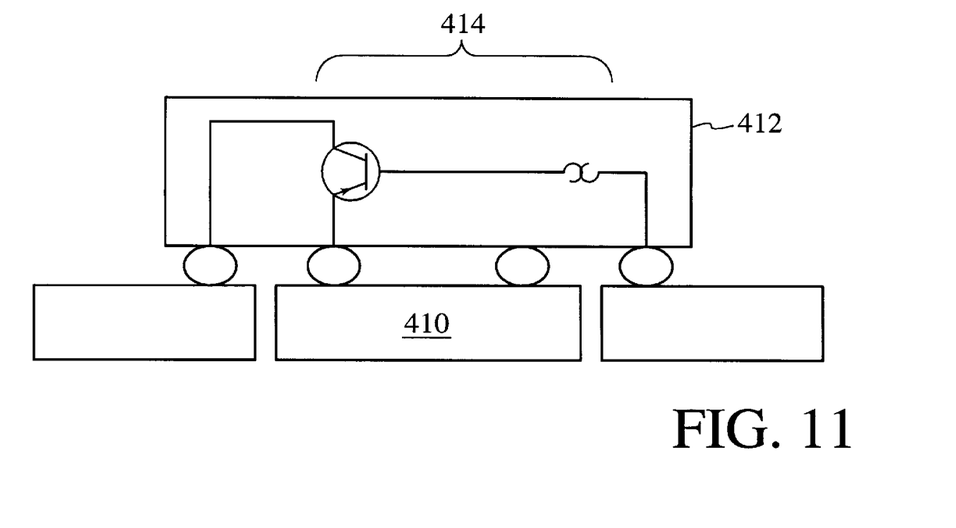
FIG. 11 is a plan schematic view of the carrier shown in FIGS. 2A–2C, in accord with a third alternate embodiment.
Figure 12:
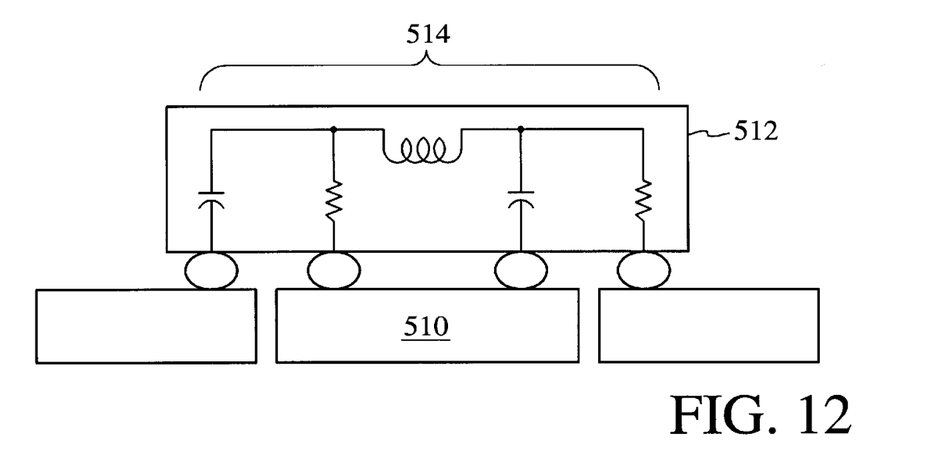
FIG. 12 is a plan schematic view of the carrier shown in FIGS. 2A–2C, in accord with a fourth alternate embodiment.

Referring to FIG. 9, given that the carrier 112 is provided interconnections comparable to on-chip interconnects, various circuits may be provided in the carrier 212 that are necessary to the operation of the ICs 210 which may be attached thereto. This provides a greater degree of flexibility when producing ICs 210 that can result in a per-unit-price-reduction. For example, considering the vast quantity of devices on a typical IC, the minimum feature dimension is on the order of 0.25 micrometer. There are often, however, devices associated with an IC that need not be scaled to have a minimum feature dimension on the order of 0.25 micrometer. One such device is an I/O buffer 214. With the carrier 212, the I/O buffers 214 may be formed therein and still provide the same function to the IC, but at a reduced cost. The I/O buffers may be constructed so that they have a much larger dimension than the features on the IC. This saves manufacturing costs with respect to the IC 210 by avoiding having to unnecessarily scale circuits to small dimensions. Rather, these circuits, in this example, I/O buffers 214, may be made with much larger feature dimensions, e.g., on the order of 1 micrometer. In a similar fashion, other devices may be provided in the carrier 312 which facilitate the operation of the IC 310 associated therewith, such as a clock distribution network 314 shown in FIG. 10, a power distribution network with a temperature sensor 414, shown in FIG. 11, as well as an imbedded RLC circuitry 514, shown in FIG. 12.

Figure 13:
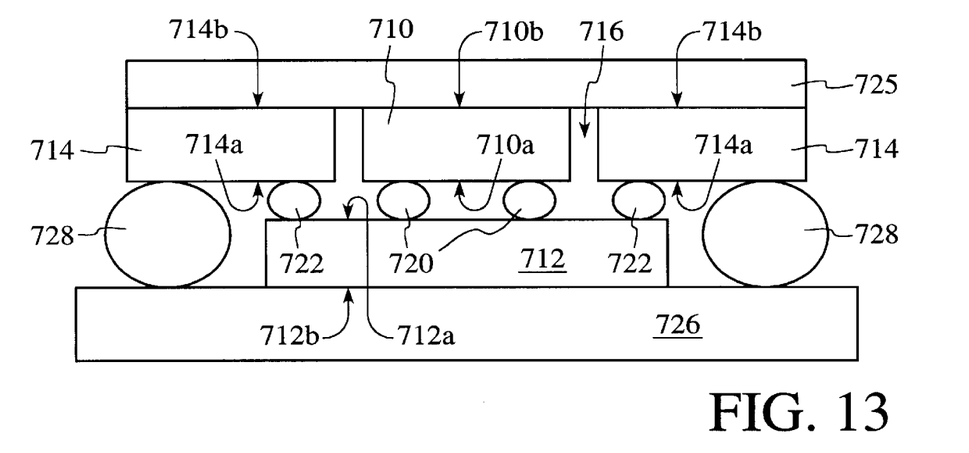
FIG. 13 is a plan view of the IC-carrier-board subassembly, shown in FIGS. 2A–2C mounted to a substrate in accord with the present invention.

Referring to FIG. 13, the IC 710 is shown having a mounting surface 710a and a major surface 710b, disposed opposite to the mounting surface 710a. The mounting surface 710a is coupled to a mounting surface 712a of the carrier 712 employing solder bumps 720, as discussed above. The board 714 includes a mounting surface 714a and a major surface 714b, disposed opposite thereto, with the carrier 712 being mounted to the mounting surface 714a employing solder bumps 722, as discussed above, so that the IC 710 is disposed within the aperture 716. Preferably, the relative dimensions of solder bumps 720 and 722 are chosen so that the major surface 710b is coplanar with major surface 714b. In this fashion, a heat sink 725 may be mounted to both the major surface 710b of the IC 710 and the major surface 714b of the board 714. The heat sink provides mechanical support, in addition to thermal relief, to both the board 714 and the IC 710. This subassembly may be further mounted to a package substrate, such as a printed circuit board 726, using solder bumps 728, with the carrier 712 disposed between the board 714 and the printed circuit board 714.

Figure 14:
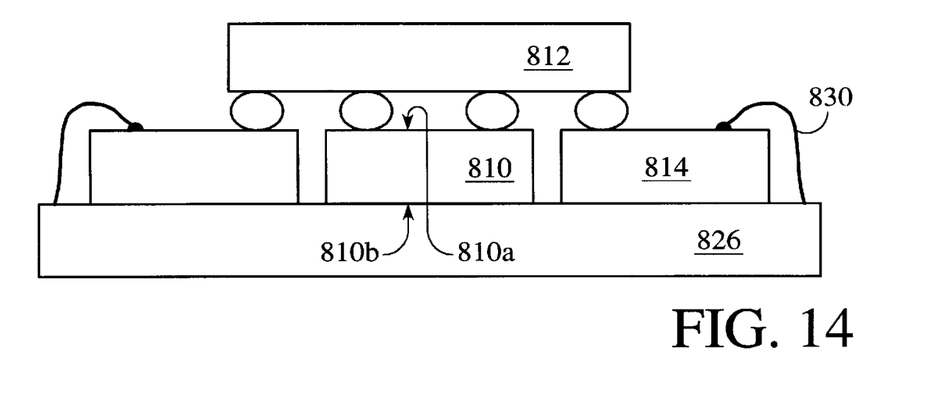
FIG. 14 is a plan view of the IC-carrier-board subassembly, shown in FIG. 13, mounted to a substrate in accord with an alternate embodiment of the present invention.

Alternatively, the orientation of the subassembly may be inverted so that the IC 810 and the board 814 are disposed between the carrier 812 and the printed circuit board 826, shown in FIG. 14. In this fashion, the major surface 814b of the board 814 and the major surface 812b are attached to the printed circuit board 826. Electrical communication may be achieved between the printed circuit board 826 and the mounting surface 814a of the board 814 using wire bond techniques, shown as wire 830.

What is claimed is:

1. A substrate for an integrated circuit comprising:

an insulative member having a plurality of signal traces and a plurality of bond sites disposed thereon, with said plurality of bond sites enclosing a region of said insulative member and a subset of said plurality of signal traces being associated with said plurality of bond sites so that each of said signal traces of said subset extends from one of said plurality of bond sites, away from said region, defining an electrically nonconductive area; and a routing carrier having a plurality of conductive traces and a plurality of conductive bond pads arranged in first and second subsets so that each of the bond pads of said first subset superimposes one of a subset of bond sites and each of the bond pads of said second subset superimposes said area, when said routing carrier is placed in a final seating position with respect to said insulative member, with a first subgroup of said plurality of conductive traces superimposing said area and extending between a pair of bond pads of a sub-portion of said first subset so as to place a pair of the bond sites of said subset of bond sites in electrical communication, forming a pass-through, with a second subgroup of said plurality of conductive traces placing one of the bond pads of said first subset in electrical communication with one of the bonds pads of said second subset, with said second subgroup of conductive traces being electrically insulated from said sub-portion of said first subset.

2. The substrate as recited in claim 1 wherein said integrated circuit is in electrical communication with bond pads of said second subset is positioned on said routing carrier so as to superimpose said nonconductive area.

3. The substrate as recited in claim 1 wherein said routing carrier includes opposed major surfaces and said nonconductive area includes an aperture extending between said opposed major surfaces.

4. The substrate as recited in claim 1 wherein said integrated circuit is in electrical communication with bond pads of said second subset and is positioned on said routing carrier and said nonconductive area includes an aperture having an area which exceeds a cross-sectional area of said integrated circuit, said integrated circuit being positioned on said routing carrier so as to fit within said aperture, upon said routing carrier reaching said final seating position with said insulative member.

5. The substrate as recited in claim 1 wherein said integrated circuit and said routing carrier have matching coefficients of thermal expansion.

6. The substrate as recited in claim 1 wherein said integrated circuit is in electrical communication with bond pads of said second subset to superimpose said is positioned on said routine carrier so as to superimpose said nonconductive area, with said nonconductive area having dimensions which are greater than a cross-sectional area of said integrated circuit.

7. The substrate as recited in claim 1 wherein both said insulative member and said routing carrier are formed from silicon.

8. The substrate as recited in claim 1 wherein said routing carrier includes electronic circuitry formed therein and in electrical communication with said integrated circuit, with said electrical circuity selected from the set consisting of input/output buffer, clock distribution network, power distribution network, temperature sensor and RLC circuit.

9. The substrate as recited in claim 1 wherein said pair of bond sites placed in electrical communication is dependent upon an orientation of said routing carrier with respect to said insulative member.

10. A substrate for an integrated circuit comprising:

an insulative member having a plurality of signal traces, an aperture and a plurality of bond sites disposed about a perimeter of said aperture, with a subset of said plurality of signal traces being associated with said plurality of bond sites so that each of said signal traces of said subset extends from one of said plurality of bond sites, away from said aperture; and a routing carrier having a plurality of conductive traces and a plurality of conductive bond pads arranged in first and second subsets so that each of the bond pads of said first subset superimposes one of said plurality of bond sites and each of the bond pads of said second subset superimposes one aperture, when said routing carrier is placed in a final seating position with respect to said insulative member, with a first subgroup of said plurality of conductive traces superimposing said aperture and extending between a pair of bond pads of a sub-portion of said subset so as to place a pair of said bond sites in electrical communication, with said pair of said plurality of bond sites place in electrical communication, forming a pass-through, with a second subgroup of said plurality of conductive traces placing one of the bond pads of said first subset in electrical communication with one of the bonds pads of said second subset, with said second subgroup of conductive traces being electrically insulated from said sub-portion of said first subset.

11. The substrate as recited in claim 10 wherein said routing carrier includes electronic circuitry formed therein and in electrical communication with said integrated circuit, with said electrical circuity selected from the set consisting of input/output buffer, clock distribution network, power distribution network, temperature sensor and RLC circuit.

12. The substrate as recited in claim 11 wherein said integrated circuit is in electrical communication with bond pads of said second subset and said integrated circuit is positioned on said routing carrier so as to fit within said aperture, upon said routing carrier reaching said final seating position with said insulative member.

13. The substrate as recited in claim 12 wherein said integrated circuit and said routing carrier have matching coefficients of thermal expansion.

14. The substrate as recited in claim 13 wherein both said insulative member and said routing carrier are formed from silicon.

15. The substrate as recited in claim 14 wherein said insulative member has a plurality of apertures, each of which has said plurality of bond sites disposed about a perimeter thereof, with a subset of said plurality of signal traces extending between a pair of bond pads, one of which is associated with one of said plurality of apertures, with the remaining bond pad being associated with one of the remaining apertures.

16. A substrate for an integrated circuit comprising:

an insulative member having a plurality of signal traces, a plurality of apertures and a plurality of bond sites, with each of said plurality of apertures having multiple bond sites disposed about a perimeter thereof, with a subset of said plurality of signal traces extending between a pair of bond pads, one of which is associated with one of said plurality of apertures, with the remaining bond pad being associated with one of the remaining apertures; and a plurality of routing carriers, each of which has a plurality of conductive traces and a plurality of conductive bond pads, a routing carrier having a plurality of conductive traces and a plurality of conductive bond pads arranged in first and second subsets so that each of the bond pads of said first subset superimposes one of said multiple bond sites and each of the bond pads of said second subset superimposes one of said plurality of apertures when said routing carrier is placed in a final seating position with respect to said insulative member, with said integrated circuit being coupled to the bond pads of said second subset and positioned on said routing carrier so as to fit within one of said plurality apertures in said final seating position, with a first subgroup of said plurality of conductive traces superimposing said aperture and extending between a pair of bond pads of a sub-portion of said subset so as to place a pair of said bond sites in electrical communication, with said pair of bond sites in electrical communication being dependent upon an orientation of said routing carrier with respect to said insulative member and forming a pass-through, with a second subgroup of said plurality of conductive traces placing one of the bond pads of said first subset in electrical communication with one of the bonds pads of said second subset, with said second subgroup of conductive traces being electrically insulated from said sub-portion of said first subset.

17. The substrate as recited in claim 16 wherein each of said plurality of bond pads includes a solder bump attached thereto.

18. The substrate as recited in claim 17 wherein said routing carrier includes opposed major surfaces, with said plurality of apertures extending between said opposed major surfaces and all of said bond pads being disposed proximate to one of said opposed major surfaces facing said insulative member upon reaching said final seating position.

19. The substrate as recited in claim 18 wherein said integrated circuit and said routing carrier have matching coefficients of thermal expansion.

20. The substrate as recited in claim 19 wherein both said insulative member and said routing carrier are formed from silicon.

\* \* \* \* \*